United States Patent [19]

Daniel

[11] 4,411,490
[45] Oct. 25, 1983

[54] APPARATUS FOR COLLECTING, DISTRIBUTING AND UTILIZING SOLAR RADIATION

[76] Inventor: Maurice Daniel, 1733 19th St., N.W., Washington, D.C. 20009

[21] Appl. No.: 178,784

[22] Filed: Aug. 18, 1980

[51] Int. Cl.³ .............................................. G02B 5/14
[52] U.S. Cl. .............................. 350/96.10; 350/96.18; 350/96.24; 350/96.28; 350/262; 362/32; 126/440
[58] Field of Search ............... 350/96.10, 96.15, 96.16, 350/96.18, 96.19, 96.20, 96.24, 96.28, 258, 259, 350/260, 262, 265; 362/32; 126/440, 441

[56] References Cited

U.S. PATENT DOCUMENTS

| | | | |
|---|---|---|---|
| 3,314,331 | 4/1967 | Wiley | 88/24 |
| 4,026,267 | 5/1979 | Coleman | |
| 4,198,953 | 4/1980 | Power | 350/258 X |
| 4,292,959 | 10/1981 | Coburn, Jr. | 350/262 X |
| 4,297,000 | 10/1981 | Fries | 350/96.24 |
| 4,302,069 | 11/1981 | Niemi | 350/96.15 |

FOREIGN PATENT DOCUMENTS

| | | | |
|---|---|---|---|
| 55-53310 | 4/1980 | Japan | 350/96.18 |
| 7705026 | 11/1977 | Netherlands | 350/259 |
| 436046 | 11/1967 | Switzerland | 350/96.10 |
| 1374766 | 11/1974 | United Kingdom | 350/500 |
| 1501297 | 2/1978 | United Kingdom | 350/258 |
| 2029883 | 3/1980 | United Kingdom | 350/96.24 |

OTHER PUBLICATIONS

*Nasa Tech Briefs*, vol. 3, No. 2, Summer 1978, Edwards, "Optics for Natural Lighting," pp. 209–211.

*Primary Examiner*—John D. Lee
*Assistant Examiner*—Frank Gonzalez
*Attorney, Agent, or Firm*—Sixbey, Friedman & Leedom

[57] ABSTRACT

The apparatus for collecting, distributing and utilizing solar radiation includes a solar collection panel (24) having an array of solar gathering cells (1, 37) which provide radiation to a light collecting unit (3, 4, 39). This light collecting unit (3, 4, 39) provides radiation as a single beam to a lens system (5, 7) which provides a coherent beam to a lightpipe (8). This beam is then directed to use units such as a light to electricity converter (100, 154), heat distributing elements (202, 213, 230, 244, 270) and light distributing elements (322, 336, and 348).

20 Claims, 21 Drawing Figures

APPARATUS FOR COLLECTING, DISTRIBUTING AND UTILIZING SOLAR RADIATION

DESCRIPTION

1. Technical Field

The present invention relates to means for collecting and utilizing solar energy and more particularly to means for collecting solar energy at a remote location and transmitting the energy so collected to a variety of utilization devices.

2. Background Art

Recent interest in establishing public and private alternatives to the conventional use of fossil and nuclear fuels for providing heat and power has focused extensively on the exploitation of solar radiation as a source of relatively inexpensive, renewable and non-polluting energy. This interest in turn has led to new advances in the art of collecting and utilizing solar radiation. Development in the field of solar cell technology, for example, has made possible the realization of ever greater efficiencies in converting sunlight directly into electricity. Numerous improvements have also been introduced into systems such as those employing solar heat exchangers and solar boilers for extracting and applying the heat of solar radiation.

Notwithstanding the progress heretofore achieved, most solar devices continue to suffer from several common yet serious limitations attributable to the fact that utilization of solar energy generally takes the form of in situ utilization. The collection of solar radiation is generally undertaken at an outdoor location, and most solar devices are designed to perform their conversion or heat transfer functions at the solar collection site. Thus, most solar devices are exposed to the deleterious effects of the elements. A particularly serious problem is created when sensitive and fragile solar cells are subjected to such exposure. The corrosive action of the weather significantly interferes with the operation of solar cell arrays, and the consequent maintenance and replacement costs appreciably add to the overall expense of a solar cell conversion system. Additional problems arise when solar heat exchangers or solar boilers are involved. If the heat exchanger or boiler is designed to furnish heat to a residential unit, the solar collector is often mounted on the roof of the unit and the requirement of close physical proximity between the collector and the heat exchanger or boiler necessitates costly reinforcement of the structural members of the roof in order to support the weight of the entire collection and heat exchange system. Alternately, when the solar collector is located on the ground away from the residential unit to be heated, complicated piping and valve mechanisms are needed to transport the heat exchange medium from the collection site to heat radiators inside the unit. The expense of the entire collection and heat transfer system is again increased, while the process of transporting the heat exchange medium and the accompanying heat loss can lead to further costly inefficiencies. In view of these disadvantages, a means for collecting and transmitting solar energy from an optimum collection location to a solar utilization device positioned in a separate but optimum utilization location would greatly enhance the operational efficiency, financial attractiveness and flexibility of a solar conversion system.

The rapidly-growing field of fiber optics furnishes perhaps the most promising solution to the problem of developing a truly efficient solar collection and utilization system. Generally speaking, an optical fiber is a long thin flexible coated rod or core of transparent material such as glass or plastic surrounded by a second transparent material or cladding. The cladding material has a lower index of refraction than the core material. Light travelling down the length of the core at shallow angles with respect to the longitudinal axis of the core is internally reflected at the core-cladding interface to effectively "trap" the light within the core material unitl the light reaches the end of the optical fiber. It can therefore be seen that optical fibers offer a convenient means for conducting sunlight from one point to another.

The optical solar energy converter disclosed in U.S. Pat. No. 3,379,394, issued to Bialy on Apr. 23, 1968, provides an early example of the use of optical fibers to receive and transmit solar radiation from a solar collection site to a thermoelectric unit. Additional examples of solar collectors with optical fiber networks can be found in U.S. Pat. No. 3,780,722, issued to Swet on Dec. 25, 1973; U.S. Pat. No. 4,026,267, issued to Coleman on May 31, 1977; and U.S. Pat. No. 4,174,978, issued to Lidorenko et al on Nov. 20, 1979. In spite of the many advantages to be gained from employing optical fibers to gather and distribute solar radiation, however, the principal economies of size and cost available through the use of fiber optics are not realized in systems of the type noted above. Specifically, all of the aforementioned optical fiber solar distribution systems rely upon separate optical fibers or optical bundles to distribute incident sunlight from each focal point or receiving location on a solar collecting surface. A conventional solar collecting panel having a large array of solar receiving devices, such as illustrated in FIG. 1 of the previously cited Coleman reference, consequently requires a correspondingly large number of optical fibers or fiber bundles to conduct light from the collecting surface to the ultimate solar utilization device. The attendant bulk, complexity and expense of transmitting devices having large numbers of fibers or optical bundles may, of course, prove prohibitive in many situations, and it would be of obvious benefit to provide a means for distributing solar radiation through a relatively small number of optical fiber bundles each having a relatively small cross-sectional area. To this end, it is necessary to provide a means for concentrating solar radiation received at a solar collection site prior to transmitting the radiation to the utilization site.

Apart from systems designed to receive and distribute solar radiation, much recent attention has been devoted to the development and construction of practical devices for utilizing solar energy. Solar battery-type arrangements which convert sunlight directly into electricity are known, as evidenced by U.S. Pat. No. 4,153,475, issued to Hider et al on May 8, 1979. Although of obvious utility, arrangements of the type disclosed in Hider et al are principally intended to function through direct interaction with incident sunlight. No provision has been made for adapting prior art solar batteries or other solar utilization devices to receive solar radiation indirectly from optical fiber distribution systems arranged to transmit light from an optimum solar collection site to an optimum utilization site. On the other hand, light utilization devices which have been constructed for use with prior art optical fiber transmission systems, such as the light guide disclosed in U.S. Pat. No. 4,017,150, issued to Imai on Apr. 12, 1977, or the terminal lens sets disclosed in the Edmund Scientific Co. catalog, page 59 (Spring/Summer 1979), have not been adapted to interface with solar radiation distribution systems. It is thus apparent that solar utilization structures compatable with relatively simple, efficient and inexpensive solar collection and distribution systems would prove of great value in a wide variety of both industrial and residential settings.

DISCLOSURE OF THE INVENTION

It is therefore a primary object of the present invention to provide a practical means for gathering solar radiation at an optimum collection site and distributing radiation so gathered to an optimum utilization site.

It is additional object of the present invention to provide a means for gathering solar radiation at an optimum collection site and concentrating the radiation so gathered to enable high intensity transmission of the solar radiation through a relatively small number of optical fiber bundles to a solar utilization device located at an optimum utilization site.

It is another object of the present invention to provide a solar collection panel including at least one radiation gathering cell for gathering solar radiation and a light collection chamber in combination with a light trap for redirecting and removing the gathered solar radiation from the solar collection panel.

It is another object of the present invention to provide a solar collection panel wherein the panel includes a radiation gathering cell for gathering incident solar radiation and a light collection chamber in combination with reflecting elements and a light trap for redirecting and removing the solar radiation so gathered to a remote utilization site with a minimum of optical loss.

It is another object of the present invention to provide a variety of solar utilization devices for use in connection with a solar collection panel which gathers solar radiation at an optimum collection site and distributes the radiation so gathered to the utilization devices.

It is still another object of the present invention to provide a light-to-electricity converter which receives solar radiation from a remote solar collection site and which thereafter converts the received solar radiation into usable electricity.

It is further object of the present invention to provide a light-to-electricity converter which employs a light-emitting fabric comprised of woven optical fibers to aid in converting solar radiation gathered at a remote solar collection site into electricity at an optimum utilization site.

It is also an object of the present invention to provide a solar welder for converting solar radiation into productive heat energy suitable for use during welding operations.

It is yet an additional object of the present invention to provide a heat distributing element capable of receiving infrared radiation from a remote solar collection site and distributing the infrared.

It is still another object of the present invention to provide illuminating devices for receiving visible radiation from a remote solar collection site and for distributing the visible radiation so received in the form of usable illumination.

These and other objects of the present invention are accomplished by a solar collection and utilization system including a solar collection panel comprised of one or more solar gathering cells which gather and focus incident solar radiation through optical windows into a light gathering chamber. The light gathering chamber in turn employs a plurality of conical mirrors to redirect the solar radiation toward an optical entrance window, whereupon a light trap captures and removes the solar radiation from the light collection chamber. Light traveling through the light trap escapes via exit windows formed at the end of the light trap opposite the entrance window and is subsequently focused by a lens system into a lightpipe for distribution to a remote utilization site.

One type of utilization device takes the form of a light-to-electricity converter, wherein solar radiation received from a solar collection panel positioned at a remote solar collection site is transmitted through a light-emitting fabric overlying a plurality of solar cells. The solar cells generate usable electricity from the solar radiation leaving the light-emitting fabric, which electricity may be removed from the light-to-electricity converter and employed in conventional electric devices. An alternative form of the light-to-electricity converter utilizes an optical tree-type structure in lieu of a light-emitting fabric to distribute light received from the solar collection panel to solar cells mounted within the converter. The optical tree structure includes a trunk portion with a plurality of branch portions radiating therefrom.

Additional solar utilization devices in the form of a solar welder which focuses infrared radiation to furnish a point source of heat suitable for welding operations, heat distributing devices for uniformly distributing infrared radiation as a general source of heat, and illuminating devices for distributing visible radiation as a source of usable illumination are also disclosed.

BRIEF DESCRIPTION OF THE DRAWINGS

The various features, objects and advantages of the present invention will become more apparent from the following Brief Description of the Drawings, wherein.

BEST MODE FOR CARRYING OUT THE INVENTION

The preferred embodiment for a solar collection panel of the present invention will now be described in detail with reference to FIGS. 1A and 1B. The solar collection panel is indicated generally at 24 in FIG. 1A. Solar collection panel 24 includes an array of solar gathering cells 1 which gather incident sunlight, a light collection chamber 3 which coherently redirects light gathered by solar gathering cells 1, a light trap 4 which removes the redirected light from light collection chamber 3, a lens system 26 which focuses and intensifies the removed light, and a light pipe 8 which distributes the intensified solar radiation to various solar utilization devices. For purposes of illustration, only fourteen solar gathering cells 1 arranged in a hexagonal pattern across the surface of solar collection panel 24 are disclosed in FIG. 1A. In practice, however, each solar collection panel of the present invention may contain hundreds of solar gathering cells arranged in any suitable pattern, and an actual solar collection device may employ several such solar collection panels.

Figure 1A:
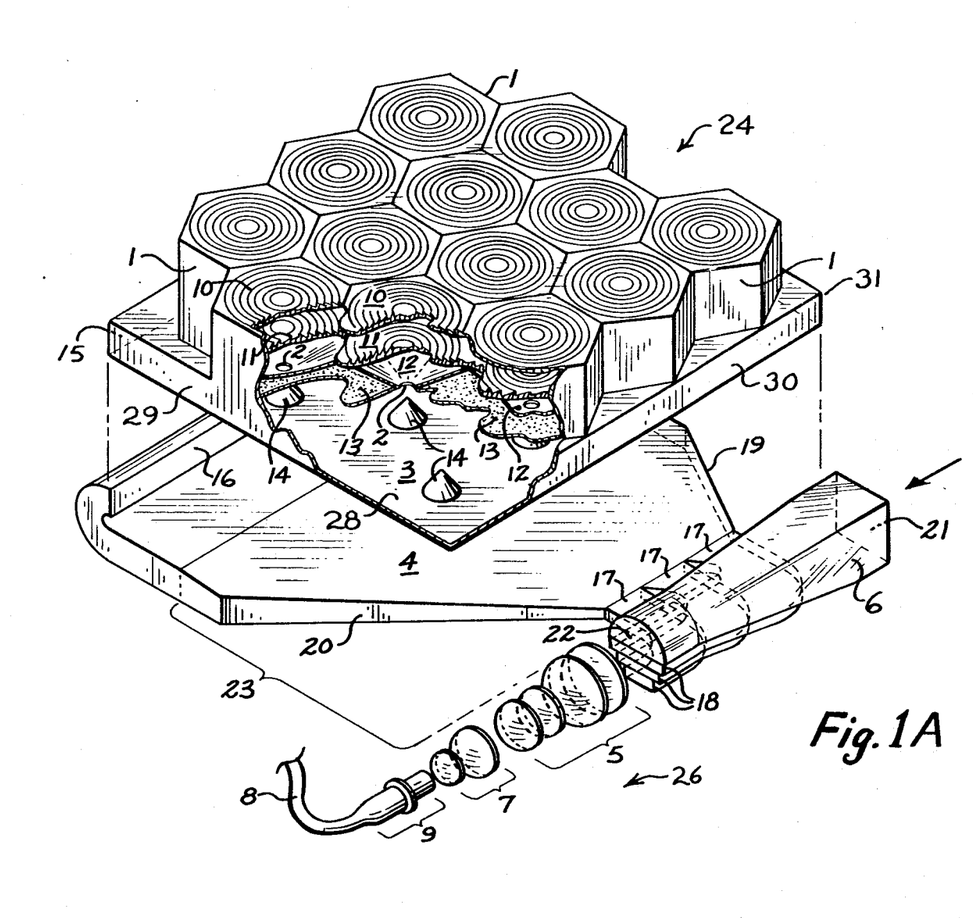
FIG. 1A is a perspective view of a solar collection panel constructed in accordance with the present invention.
Figure 1B:
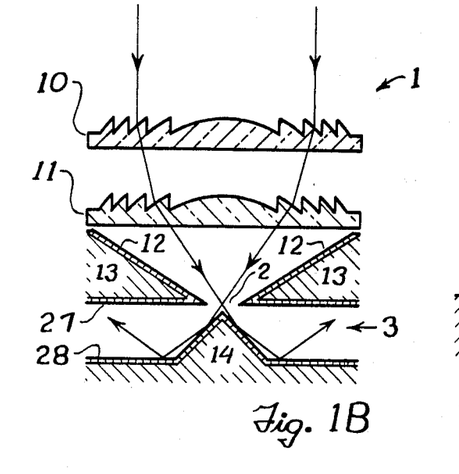
FIG. 1B is a cross-sectional view illustrating the placement of the lens elements of a solar gathering cell relative to an optical window formed in the light collection chamber of the solar collection panel illustrated in FIG. 1A.

Turning to FIG. 1B, it can be seen that each solar gathering cell 1 consists of two Fresnel lens 10, 11 which receive solar radiation impinging upon the upper surface of panel 24 and focus substantially all of the solar radiation so received onto an optical window 2 formed at the top 27 of light collection chamber 3. The two Fresnel lenses are necessary in order to minimize the distance required to focus solar radiation on window 2, and a small air gap preferably separates one lens from the other. A six-sided pyramidal mirror 12 extends from the edges of the inner Fresnel lens 11 and tapers to the edge of optical window 2. Pyramidal mirror 12 serves to direct some of the sunlight improperly scattered away from the focal point of the Fresnel lenses back toward the optical window. A plastic foam 13 or similar material may be used to fill and insulate the space between the top 27 of light collection chamber 3 and the lower surface of the pyramidal mirror 12.

Again as illustrated in FIG. 1A, light collection chamber 3 extends beneath solar gathering cells 1 and comprises a rectangular structure enclosed at the top 27, bottom 28 and three sides 29, 30, 31 by a casing having highly reflective interior surfaces. A fourth side 15 of light collection chamber 3 is open to permit light to escape therefrom. A plurality of conical mirrors 14 are secured to the bottom 28 of light collection chamber 3 and are respectively positioned to receive solar radiation passing through the optical windows 2 from the corresponding solar gathering cells 1. Conical mirrors 14, which in the preferred embodiment are formed with a 90° apex angle, have the effect of scattering incident solar radiation in a direction parallel to the top and bottom planes of the light collection chamber. The solar radiation scattered from the conical mirrors is subsequently reflected back and forth between the interior surfaces of sides 29, 30, 31 until escaping from light collection chamber 3 at open side 15. Some light passing through any given optical window 2 will initially scatter off the conical mirror associated therewith only to be re-reflected from another conical mirror toward the top surface 27 of the light collection chamber. In such a case the light may escape through an optical window 2 or simply reflect back and forth between the top 27 and bottom 28 surfaces of light collection chamber 3. In this event optical loss will occur, but such loss can be minimized through careful choice of the dimensions involved in constructing the solar collection panel components.

Light escaping from light collection chamber 3 through open side 15 enters a rectangular optical entrance window 16 formed at one end of light trap 4. As previously discussed, light trap 4 is designed to remove light from the light collection chamber. To this end, light trap 4 is fabricated from a single piece of optical grade plastic which is capable of channeling light from rectangular entrance window 16 to a series of progressively elongated light guides 17 formed at the end of light trap 4 opposite rectangular entrance window 16. Each light guide 17 has an exit window 18 through which light can escape. The cross-sectional areas of the exit windows 18 vary in proportion to the progressive lengths of the corresponding light guides 17 and all of the light guides 17 may be bent, curved and stacked as illustrated in FIG. 1A such that exit windows 18 vertically align to face lens system 26. Apart from rectangular entrance window 16 and exit windows 18, all of the interior surfaces of the light trap are optically coated or processed to render the light trap highly reflective to internal light. Thus, a substantial portion of the light escaping through the open side 15 of light collection chamber 3 is directed through light trap 4 to exit windows 18. If desired, the overall bulk of light trap 4 can be reduced by tapering the sides of the light trap as indicated at 19 and 20.

Light leaving the exit windows 18 in light guides 17 passes through lens system 26 where a first series of lenses 5 reduces the angular divergence of the light to form a coherent beam. A second series of lenses 7 receives the coherent beam from lens series 5 and further reduces the angular divergence of the light contained therein to focus the beam through an optical coupler 9 and on into the end of lightpipe 8. Lightpipe 8, which comprises a bundle of optical fibers bound together and surrounded by one or more protective coatings of generally opaque material, in turn serves to distribute light from solar collection panel 24 to various remote solar utilization sites. Both ends of the lightpipe are cut and polished to form flat, optically transmissive surfaces. Where the flow of light along the lightpipe is generally unidirectional, the flat optical surfaces may be referred to as optical input and output windows in accordance with the direction of light flow. An optical coupler such as optical coupler 9 is secured to each flat optical surface and serves to conduct light into or out of the lightpipe depending upon whether the flat optical surface is functioning as an input or output window. Although hundreds or even thousands of optical fibers can be bound together in the lightpipe, the bundled fibers and associated coatings are arranged such that the resulting lightpipe exhibits some degree of flexibility. Lightpipes can vary from one-eighth of an inch to over an inch in diameter.

If desired, a light channel 6 for carrying light from adjacent solar collection panels (not shown) may be positioned atop the stacked light guides 17. Light leaving the transparent face 22 of light channel 6 is combined in lens system 26 with the light leaving exit windows 18 and is likewise focused into optical coupler 9 and lightpipe 8. Light channel 6 is fabricated from a solid piece of optical quality plastic and, in a manner analogous to light trap 4, contains surfaces highly reflective to interior light. A rear optical window 21 can be formed in light channel 6 to serve as a focal point for light beamed from the exit windows in the light trap of an adjacent solar collection panel (not shown) through an additional series of lenses (not shown) similar to lens series 5. Optical window 21, if employed, has a greater cross-sectional area than the cross-sectional area of optical window 22.

The output of the solar collection panel 24 illustrated in FIG. 1 is focused into a single optical coupler 9 and lightpipe 8. In practice, however, a plurality of solar collection panels are usually mounted in a large rectangular matrix arrangement on the roof of a building or other solar collection site, and the simple optical coupler associated with the last panel in each matrix row of solar collection panels is replaced with an optical merge device. A lightpipe trunk line of much greater cross-sectional area than lightpipe 8 can then be strung along the edge of the solar collection panel matrix between the optical merge devices. Light transmitted through the light channels associated with each matrix row, such as light channel 6, is then combined in the lightpipe trunk line via the optical merge devices with light received from the light channels of other matrix rows to form a single high intensity beam in the lightpipe trunk line. Thereafter, the lightpipe trunk line distributes the high intensity beam to solar utilization sites. In order to permit maintenance or installation work at various points in the light distribution network, optical "on-off" switches can be positioned at appropriate locations along the lightpipe network. Moreover, because large solar collection panel matrixes may send thousands of watts of electromagnetic energy through a lightpipe network, it may also be necessary to install safety shut-off switches at additional points within the various light channels and lightpipe trunk line.

Numerous modifications to the solar collection panel of the present invention may be made for the purpose of increasing the efficiency and/or reducing the costs of the solar collection process. For example, the solar gathering cells 1 illustrated in FIGS. 1A and 1B include two Fresnel lens 10, 11 and a pyrmidal mirror 12, but other combinations of lenses and mirrors can be equally effective. Simplified versions of the solar gathering cell may be constructed using only one Fresnel lens. In many applications, the pyrimidal mirrors 12 could be entirely eliminated without substantial loss of light gathering efficiency. On the other hand, a more complex version of a solar gathering cell using three or more Fresnel lens could be fabricated to gather light approaching the solar collection panel at non-vertical angles. The Fresnel lenses may be replaced by other focusing elements such as conventional lenses or grated parabolic refractive indexed rod lenses to provide lens systems capable of narrowing the angular dispersion of the collected sunlight focused through optical windows 2. Any of the lenses employed in the various lens systems could be fabricated from transparent glass, plastic or other suitable optical material and all lenses lying in the same plane in a solar collection panel can be molded in a single sheet. Baffles would then be placed between the various solar gathering cells to prevent light collected by one cell from crossing over into the lens system of an adjacent cell. The baffles could contain highly reflective surfaces to form in essence, vertically standing mirrors between each layer of lenses. These mirrors would also serve as structural supports for keeping the layers of lenses spaced at an optimum distance from one another. The various solar gathering cells could additionally be arranged along more than one light gathering surface in a solar collection panel, or the panel could be shaped to form a curved light gathering surface.

A further variation in the construction of the solar collection panel of the present invention can employ a means such as a multiple layer interference film to split light collected by the panel into physical and infrared components. U.S. Pat. No. 3,314,331, for example, issued to Wiley on Apr. 18, 1967 and incorporated herein by reference, discloses an interference film suitable for this purpose. The interference film is mounted within light trap 4 and the electromagnetic components derived therefrom are separately directed through individual light guides and optical networks, each of which is similar to the light channel 6, lens system 26 and lightpipe 8 illustrated in FIG. 1. The optical network carrying visible radiation can supply light for interior illumination in a residence or commercial building, while the infrared optical network may be used to furnish radiant heat for a heating or hot water unit in the building.

Figure 2:
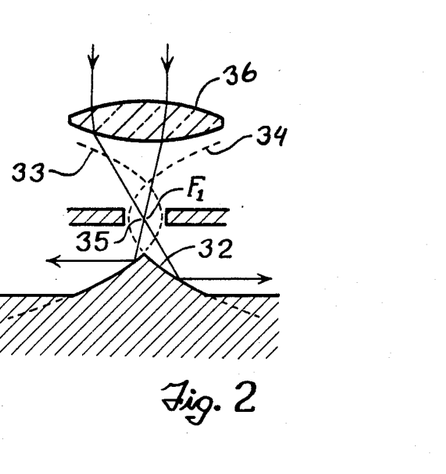
FIG. 2 is an alternative embodiment of a conical mirror for use in the light collection chamber of the solar collection panel illustrated in FIG. 1B.

A more efficient means for forming a light collection chamber for use with the present invention may be seen in FIG. 2. Each of the conical mirrors 14 secured to the bottom of light collection chamber 3, having 90° apex angles as illustrated in FIGS. 1A and 1B, is replaced by a conical mirror 32 having non-linear reflective surfaces formed in the shape of parabolas when viewed in cross-section. The parabolas, such as 33 and 34, have a center of focus $F_1$ located at the center of the corresponding optical window 35. A lens element 36 positioned above optical window 35 is placed at a predetermined distance from the optical window such that any light rays impinging on lens element 36 are focused through point $F_1$ and reflect from the parabolic sides of conical mirror 32 in accordance with well-known geometrical formulas to continue along a perfectly horizontal path relative to the floor of the light collection chamber. Thus, light losses due to reflection between the floor and the top of the light collection chamber are minimized, and the light rays reaching the light trap at the edge of the light collection chamber are collimated to a greater degree than would otherwise be the case.

Figure 3A:
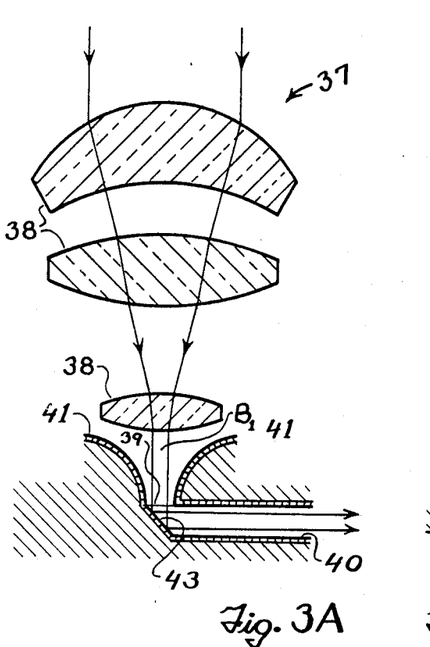
FIG. 3A shows a modified solar gathering cell for use in a solar collection panel of the present invention.

The preferred embodiment of the solar collection panel illustrated in FIG. 1A combines a high light gathering efficiency with relative ease of fabrication. A more complex arrangement of components can nevertheless be employed to achieve a theoretical light gathering efficiency approaching 100% for light incident at right angles to the panel surface. Turning to FIG. 3A, a solar gathering cell 37 utilizing a plurality of lenses 38 collects solar radiation over a wide angular range and focuses the radiation so collected into a narrow vertical beam $B_1$ with a minimum of angular dispersion. The narrow beam is passed through an optical window 39 and into a light collection chamber 40 which is uniquely associated with solar gathering cell 37 and has a small cross-sectional area relative to the cross-sectional area of light collection chamber 3 in FIG. 1A. Curved, mirrored surfaces 41 on either side of optical window 39 may be employed to redirect radiation inadvertently falling outside of beam $B_1$ back through optical window 39. A 45° mirror 43 is positioned below optical window 39 at the end of light chamber 40. Beam $B_1$, together with any incidental radiation redirected through optical window 39 by curved, mirrored surfaces 41, impinges on 45° mirror 43 and is reflected in a horizontal direction without scattering. Light collection chamber 40 serves as a light guide for conducting the horizontally traveling radiation away from the solar gathering cell 37, and all of the interior surfaces of light collection chamber 40 are coated with a highly reflective material. As previously indicated, a light collection chamber is individually associated with each solar gathering cell 37. Consequently, a single solar collection panel constructed using the solar gathering cells of FIG. 3A would contain a large number of light collection chambers such as light collection chamber 40. The individual light collection chambers meet at the edge of the solar collection panel, where they are all arranged to direct light toward a lens system such as lens system 26 in FIG. 1A. It can be seen that the use of lenses 38 and 45° mirrors 43 in conjunction with individual light collection chambers 40 substantially eliminates the scattering of solar radiation within the solar collection panel, and hence essentially all of the light entering the panel may be gathered and made available for subsequent distribution to solar utilization devices.

Figure 3B:
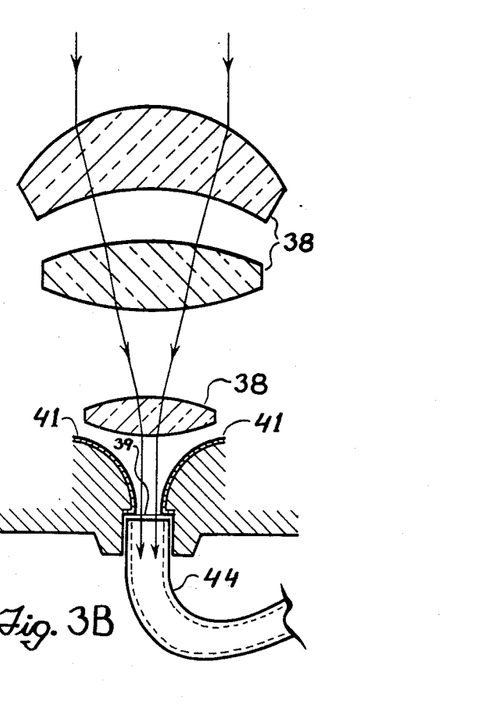
FIG. 3B shows another modified solar gathering cell for use in a solar collection panel of the present invention.
Figure 4A:
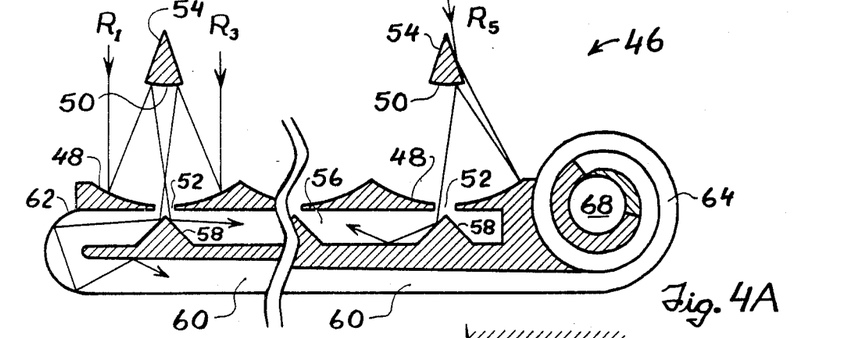
FIGS. 4A, 4B and 4C illustrate an embodiment of an alternative solar collection panel constructed in accordance with the present invention.
Figures 4B, 4C, 5:
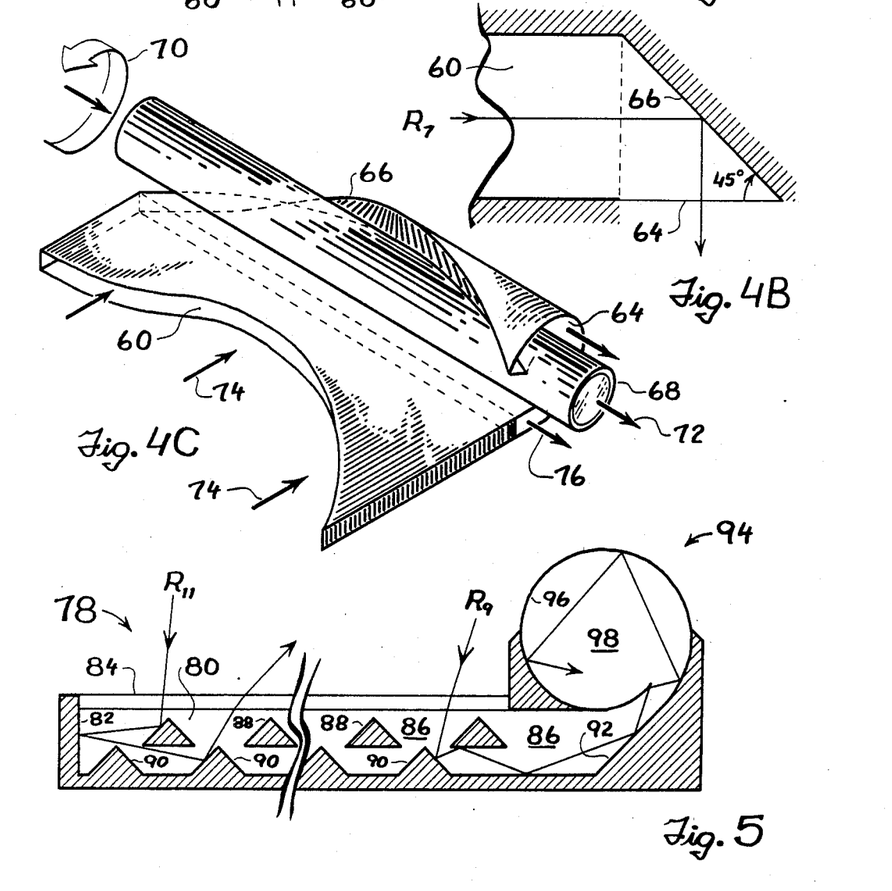
FIG. 5 is a cross-sectional view of another alternative embodiment of a solar collection panel constructed in accordance with the present invention.

FIG. 3B illustrates a modification of the solar gathering cell of FIG. 3A, wherein like elements are designated by like reference numerals. 45° mirror 43 and light collection chamber 40 of FIG. 3A are replaced by an individual optical fiber 44 which is coupled directly to the optical window 39. The various optical fibers from each solar gathering cell are then merged to form a lightpipe for directing solar radiation from the solar collection panel to a utilization device. As is the case with the FIG. 3A embodiment, scattering of light within the solar collection panel is eliminated and the radiation gathering efficiency of the panel is correspondingly enhanced.

Where the simultaneous gathering of infrared, visible and ultraviolet radiation is desired, solar collection panels 46 as illustrated in FIGS. 4A, 4B and 4C can be designed to use curved mirrors rather than lenses for gathering the radiation. Incoming radiation waves $R_1$ and $R_3$ first strike a parabolic mirror 48 and are reflected to a section of a spherical mirror 50 which focuses the radiation waves through an optical window 52 formed in the center of parabolic mirror 48. A conical mirror 54 caps the spherical mirror 50 to enable the gathering of radiation waves such as $R_5$ which would otherwise be lost. Radiation passing through optical window 52 enters a collection chamber 56 similar to the light collection chamber 3 in FIG. 1A and is reflected from a conical mirror 58 similar to conical mirror 14 in FIG. 1A. Conical mirror 58 acts to direct radiation from collection chamber 56 into a radiation trap 60 which extends from one end 62 of solar collection panel 46 and then curves underneath the solar collection panel to conduct radiation therefrom. As with light trap 4 in FIG. 1A, radiation trap 60 may be fabricated from a single piece of optical grade plastic having an external coating of optically reflective material such that radiation traveling through radiation trap 60 from collection chamber 56 undergoes total internal reflection. The internally reflected radiation escapes from the trap through an exit window 64 at the end of solar collection panel 46 opposite end 62.

As seen to best advantage in the plan view of FIG. 4B, exit window 64 is parallel to the longitudinal axis of radiation trap 60. A mirrored surface 66 formed along the end of radiation trap 60 at a 45° angle relative to exit window 64 serves to redirect radiation waves from the interior of radiation trap 60 through exit window 64. For example, a radiation wave $R_7$ traveling in a direction parallel to the longitudinal axis of radiation trap 60 is reflected by mirrored surface 66 and escapes radiation trap 60 via exit window 64 in a direction generally perpendicular to the plane of the exit window. Referring to FIG. 4C, the tip of radiation trap 60 containing exit window 64 and mirrored surface 66 may be rolled about a lightpipe 68 as indicated by arrow 70 in order to reduce the overall space necessary to accommodate the exit window. Lightpipe 68 functions to conduct radiation from an adjacent solar collection panel (not shown) in the direction of arrow 72. Radiation traveling parallel to the longitudinal axis of radiation trap 60, as indicated by arrows 74, is reflected through exit window 64 by mirrored surface 66 and generally exits trap 60 in the direction indicated by arrows 76. If desired, a lens system (not shown) may be used to merge the radiation leaving exit window 64 with the radiation traveling through lightpipe 68 in a manner analogous to the merging of light from exit windows 18 and light channel 6 by lens system 26 in FIG. 1A.

FIG. 5 illustrates another type of solar collection panel 78 constructed without lens elements. Radiation is admitted to a collection chamber 80, the interior walls 82 of which are coated with a mirror-type substance, via a simple sheet of optical glass 84 having a relatively low index of refraction. Collection chamber 80 is filled with a transparent optical grade material 86 having a relatively high index of refraction, and a series of conical mirrors 88 are suspended within the optical material 86. All external surfaces of the mirrors 88 are highly reflective. In addition, a series of conical mirrors 90 with highly reflective exterior surfaces are positioned at various intervals along the floor of collection chamber 80. A tapered portion including an inclined, mirrored surface 92 is constructed at one end of the collection chamber, and terminates in a spiral shaped mirror 94 having a highly reflective interior surface 96. Mirror 94 encloses a cavity 98 which acts as a radiation trap for conducting radiation away from collection chamber 80 and which may also be filled with a transparent, highly refractive optical grade material. One end of cavity 98 may be capped with a flat mirror (not shown) lying in a plane parallel to the plane of FIG. 5. The other end of cavity 98 is left uncovered to serve as an exit window for the radiation conducted therethrough. A radiation wave such as $R_9$ traveling toward solar collection panel 78 passes through optical glass 84 and is reflected back and forth between conical mirrors 88 and 90 and the reflective surface 96 of spiral shaped mirror 94 until leaving cavity 98 through the aforementioned exit window. Due to the simplistic construction of solar collection panel 78 it should be noted that an occasional radiation wave such as $R_{11}$ will enter collection chamber 80 only to be reflected back toward optical glass 84 at an angle greater than the critical angle of the glass. Although radiation wave $R_{11}$ will thus be lost for useful purposes, if proper care is exercised in formulating the dimensions of solar collection panel 78 this type of loss can be minimized.

Figure 6:
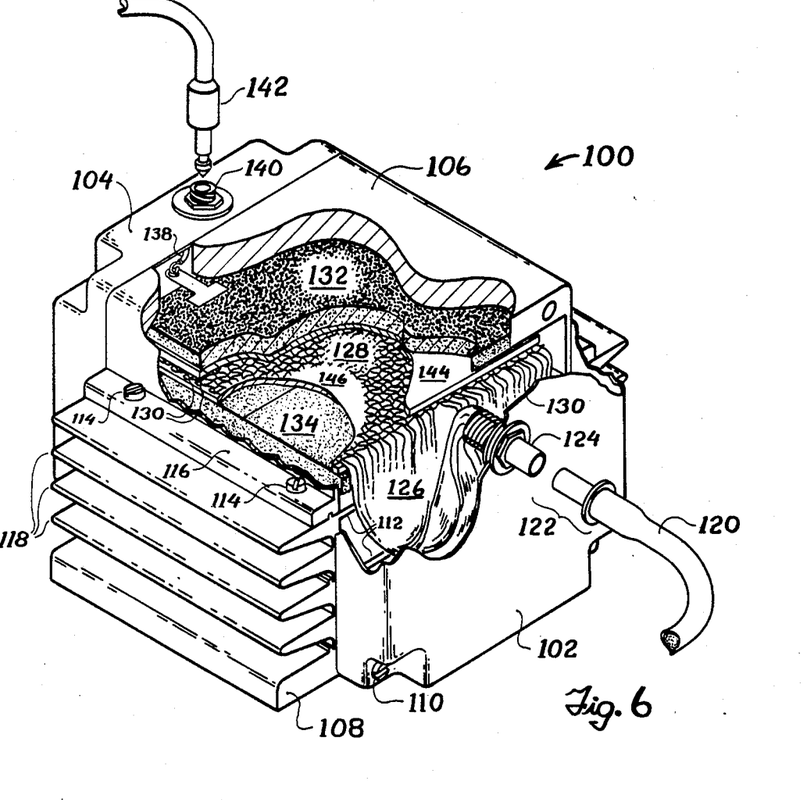
FIG. 6 is a perspective view of a light-to-electricity converter constructed in accordance with the present invention, wherein a light-emitting fabric is employed to distribute light to solar cell arrays mounted within the converter.

As previously discussed, incident radiation gathered and focused by any of the solar collection panels illustrated in FIGS. 1 through 5 may be conducted through light pipes such as light pipe 12 illustrated in FIG. 1 to a solar utilization device positioned in an optimum utilization site. One such device, in the form of a light-to-electricity converter 100 (hereinafter referred to as an LEC) is shown in FIG. 6. LEC 100 includes end covers 102, 104 fastened to top and bottom portions 106, 108 by bolts 110. End covers 102 and 104 may be constructed from sheet metal or other suitably durable material, while top and bottom portions 106, 108 may comprise thick aluminum extrusions. A plurality of parallel supporting plates 112 integrally fabricated from yet another aluminum extrusion are placed in sandwich fashion between the top and bottom portions 106, 108 to form a series of compartments in the interior of the LEC. For the sake of clarity, only the uppermost compartment is depicted in the cut-away view of FIG. 6. The supporting plates 112, which may be secured in position by bolts 114 inserted through appropriate holes (not shown) bored in a lip 116 on topportion 106, terminate, on both sides of the LEC in a series of cooling fins 118. The cooling fins complete the enclosure of the LEC, and additionally provide a means to disipate heat generated in the LEC during the light-to-electricity conversion process.

Light gathered at a solar collection panel (not shown in FIG. 6) is conducted to LEC 100 by a lightpipe 120 and passes through end cover 102 to the interior of the LEC via an optical coupler assembly comprising male coupler 122 and female coupler 124. Light emerging from the female coupler 124 is next uniformily dispersed into a plurality of optical fibers 126 attached to the inner end of the female coupler. For this purpose, female coupler 124 may take the form of a fiber optic bundle terminator such as that disclosed in U.S. Pat. No. 3,912,392, issued to Hudson on Oct. 14, 1975 and incorporated herein by reference. Various groupings of optical fibers are segrated from one another for the purpose of transmitting light to respective LEC compartments. The individual optical fibers 126 of each grouping are thereafter arranged within corresponding LEC compartment to form the warp of a piece of light emitting fabric 128, as disclosed in co-pending application Ser. No. 007,592 filed Jan. 29, 1979 to the inventor of the present invention. The woof of light emitting fabric 128 may be formed from optically inert fibers 130 if desired, but in any event fabric 128 is designed to radiate light at a uniform intensity across the entire fabric surface. Two solar cell arrays 132, 134 respectively positioned above and below light emitting fabric 128 function to convert light radiated from the fabric into electricity. Each solar cell array may be comprised of one or more conventional solar cell elements which generate electrical current in response to incident solar radiation. Alternatively, solar cell arrays 132, 134 may utilize various combinations of photogalvanic cells, such as those disclosed in U.S. Pat. No. 4,080,488 issued to Chen et al on Mar. 21, 1978 or U.S. Pat. No. 4,138,532 issued to Chen on Feb. 6, 1979, to store as well as generate electrical energy. The current from each solar cell array is collected at a terminal lug 136 and is conducted along an electrical lead 138 to a female electrical connector 140. The total electrical output from all of the LEC compartments is removed from the LEC via a male connector 142.

If desired, two sheets of photochemical glass 144, 146 may be respectively inserted between light emitting fabric 128 and photocell arrays 132, 134. Photochemical glass sheets 144, 146 are highly transparent to low or medium intensity light but darken slightly in the presence of high intensity light. Thus, the sheets act to prevent excessive light intensities from damaging the LEC solar cell arrays. The solar cell arrays can in turn be operated at maximum efficiency for a far greater precentage of time, inasmuch as the LEC components can be designed to provide total saturation of the individual solar cells at a light intensity less than the peak intensity of light received from the solar collection panels when the sun is shining brightest. On those days when the sun does produce maximum light intensity, excess radiation reaching the LEC will be harmlessly dissipated by the photochemical glass sheets 144, 146.

Figure 7:
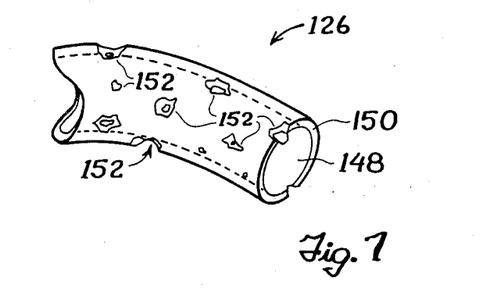
FIG. 7 is a detailed perspective view of a portion of an optical fiber used in weaving the light-emitting fabric of FIG. 6.

FIG. 7 illustrates in detail the individual optical fibers 126 which together constitute the warp for the various pieces of light emitting fabric 128. Optical fibers 126 include a core material 148 surrounded by cladding 150. During manufacture the optical fibers are mechanically or chemically deformed by etching, sandblasting, heat treating or the like to create pits or apertures 152 which penetrate cladding 150 to expose the core material 148. The resulting irregularities in the core material disrupt the uniform internal reflecting properties of optical fiber 126 and permit some of the light traveling along the fiber to escape through the apertures 152 into the surrounding environment. The deformation operation is controlled such that more apertures per unit length occur on the portion of the optical fibers 126 lying furthest from the source of light. Consequently, the net intensity of light leaking from or emitted by the optical fibers 126 can be kept at a uniform value over the entire fiber length, and the light emitting fabric 128 subsequently formed from optical fibers 126 will provide even illumination across the entire fabric surface. "Hot spots" which may be present due to unusually large apertures 152 created during the deformation operation may be minimized by adjusting the thickness of photochemical glass sheets 144 and 146 to diffuse any excessive amount of light over larger areas of the solar cell arrays 132, 134 positioned on either side of the light emitting fabric.

The optically inert fibers 130 which constitute the woof of light emitting fabric 128 may be fabricated from either transparent or reflective material, butthe use of any type of light absorbing fibers should be avoided in order to prevent loss of any light radiated from the optical fibers 126. In the preferred embodiment of the present invention, inert fibers 130 are thin metallic wires such as chrome plated copper wires which both reflect light and conduct heat from the interior of the LEC to cooling fins 118. Although not specifically illustrated in FIG. 6, the ends of the metallic fibers may be attached to the interior surfaces of the cooling fins to assist in the heating conducting process. If desired, additional metallic fibers (not shown) may be woven in parallel with optical fibers 126 to further reflect light toward solar cell arrays 132, 134, and to further conduct heat from the interior of the LEC.

Numerous modifications of the LEC illustrated in FIG. 6 are possible. For example, an optical mixer element may be included as part of female coupler 124 to enhance the uniform distribution of light among optical fibers 126. Alternatively, the single female coupler 124 may be replaced by several couplers arranged at different locations on the LEC end cover 102, or female coupler 124 may be eliminated entirely in favor of a light pipe assembly which runs directly into individual LEC compartments. Light emitting fabric 128 may be treated with various coatings having specific optical properties in order to produce more desirable distributions of light within the LEC compartments, and the light emitting fabric may be fused or laminated between the two sheets of photochemical glass 144 and 146. The photochemical glass sheets themselves may be replaced by oridnary glass or other transparent materials such as soft plastic or glass fiber mats. Sheets formed from soft plastic or glass fiber mats will of course compress somewhat when the LEC is bolted together, thereby forcing the solar cell arrays 132, 134 into a snug fit against the top and bottom surfaces of the various LEC compartments. If desired, one of the solar cell arrays in each compartment can be removed to simplify the LEC construction. When only one array of solar cells remains per compartment, the light emitting fabric associated therewith will be manufactured such that light only radiates from the fabric surface facing the array while the fabric surface opposite the array will be covered with a reflective mirror to direct light back toward the array.

The end covers 102, 104 of the LEC can be enlarged to include electrical components such as storage batteries in accordance with the particular circumstances of LEC utilization. A suitably minaturized LEC could be mounted on a portable appliance and employed with a flexible lightpipe in a manner analogous to a conventional electrical extension cord hookup. When the LEC is secured in a stationary mode, heat radiating from the cooling fins can provide a source of heat energy. Air or water can then be circulated around the LEC to effect a heat transfer function.

Figure 8:
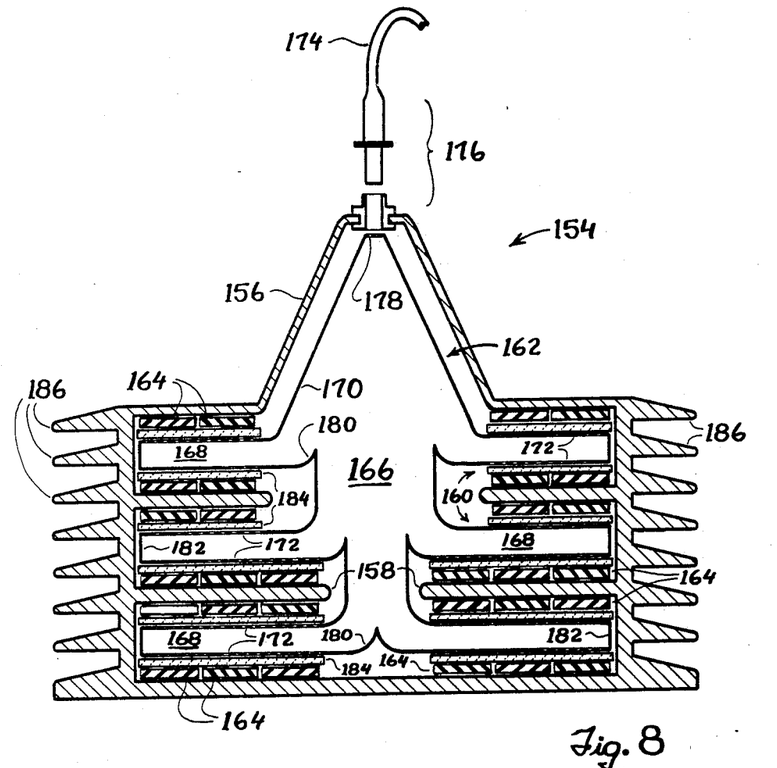
FIG. 8 is a cross-sectional view of another embodiment of a light-to-electricity converter constructed in accordance with the the present invention, wherein an optical tree structure is substituted for the light-emitting fabric of FIG. 6 as a means of distributing light to the solar cell arrays mounted within the converter.
Figure 9:
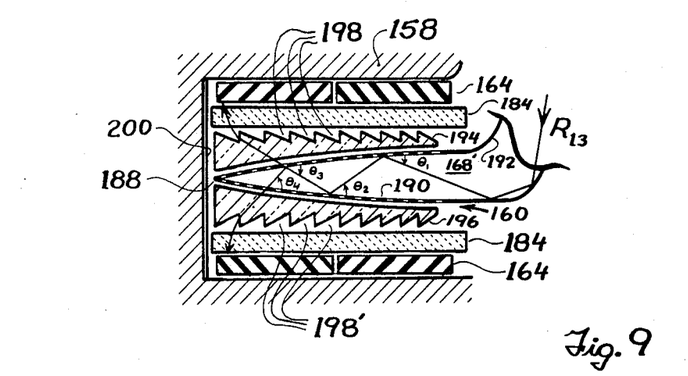
FIG. 9 is a detailed cross-sectional view of a modified optical branch used in conjunction with the optical tree of FIG. 8.

A second embodiment of an LEC constructed in accordance with the present invention, indicated generally at 154, is illustrated in cross-section in FIGS. 8 and 9. LEC 154 includes a housing 156 which surrounds and protects the optical and conversion components of the LEC. The inner surfaces of housing 156 together with a series of support arms 158 projecting inwardly from the sides of the LEC serve to divide the interior of the LEC into various compartments 160. In lieu of the light emitting fabric 128 of FIG. 6, an optical tree 162 is employed to distribute light to a plurality of solar cell arrays 164 mounted within compartments 160. Optical tree 162 is fabricated from a single piece of optical grade plastic-formed by injection mold casting, and includes a trunk portion 166 with a plurality of optical branches 168 radiating therefrom. Each optical branch 168 may extend around the entire circumference of the trunk portion 168 in true three dimensional fashion. Alternately, two sets of branches can radiate from opposite sides of trunk portion 166 as indicated in FIG. 8 and two additional sets of branches can radiate along planes horizontally perpendicular to the plane of FIG. 8 on either side of the Figure. The surfaces 170 of optical tree 162 represented in FIG. 8 by solid lines are covered with a highly reflective mirror coating, while the optical tree surfaces 172 represented by dashed lines are at least partially transparent. Light from lightpipe 174 enters the LEC 154 via optical coupling means 176 and passes into optical tree 162 through an optical window 178 formed at one end of trunk portion 166. Curved sections 180 linking the optical branches 168 to trunk portion 166 are covered with the aforementioned mirror coating in a manner such that each optical branch captures some of the light received through optical window 178. Light captured by the branches 168 in turn escapes through transparent surfaces 172 and impinges upon the solar cell arrays 164 to produce electrical current. Mirrored ends 182 of optical branches 168 reflect light reaching the end of the optical branches back toward the transparent surfaces 172. If desired, the intensity of light escaping through surfaces 172 can be made uniform by covering the areas of surfaces 172 nearest the trunk portion 166 with an optical material having partially reflective and partially refractive properties while leaving areas of surfaces 172 furthest from trunk portion 166 completely transparent (i.e., completely refractive). Photochemical glass sheets 184 may be inserted between the various optical branches 168 and solar cell arrays 164 to protect the arrays from damage due to excessive light intensities. Cooling fins 186 formed around the outside of the LEC 154 assist in dissipating test generated during the light-to-electricity conversion process.

The enlarged cross-sectional view of FIG. 9 illustrates one optical branch 168' of an optical tree wherein a more complex arrangement of optical elements is employed to distribute light more evenly across the faces of a solar cell array. As in FIG. 8 the solar cell arrays 164 and the photochemical glass sheets 184 are positioned within a compartment formed by supporting arms 158 to receive light from the optical branch 168'. In the FIG. 9 embodiment of the present invention, however, optical branch 168' is tapered rather than rectangular in shape, curving toward an apex 188 at the far end of the LEC compartment 160. Transparent areas 190 on the outer surface of the optical branch are again indicated by a dashed line and mirror coated outer surfaces 192 of the optical branch are represented by solid lines. Two optical glass or plastic elements 194, 196, each containing a plurality of grooves 198, are respectively fitted to the top and bottom of optical branch 168' between the optical branch and photochemical glass sheets 184. Grooves 198 are cut at an angle such that light entering either element 194 or 196 always emerges from one of the vertical faces of the grooves to strike optical glass elements 184 and solar cell arrays 164. A mirrored surface 200 may be positioned at the terminus of compartment 160. A light ray such as $R_{13}$ entering optical branch 168' is reflected between the mirrored surfaces 192 at the top and bottom of the optical branch until the transparent area 190 on the surface of the optical branch is reached. As FIG. 9 indicates, the curvature or taper of optical branch 168' causes light ray $R_{13}$ to strike surface 190 at progressively greater angles $\theta_1$, $\theta_2$, $\theta_3$ and $\theta_4$. In other words, due to the curvature of surface 190, $\theta_4\ \theta_3\ \theta_2\ \theta_1$. Consequently, for any given light ray there is a lesser chance that the shallower angles of incidence $\theta_1$ and $\theta_2$ will be greater than the critical angle (i.e., the maximum angle at which internal reflection occurs) of the optical branch. On the other hand, where steeper angles of incidence $\theta_3$ and $\theta_4$ occur, the likelihood that the critical angle will be exceeded increases. When combined with the fact that light along an optical conduit such as optical branch 168' generally decreases in intensity as a function of distance, the effectively increasing angle of incidence and correspondingly increasing probability of escape for any given light ray results in a more even distribution of light escaping from optical branch 168'.

Additional modifications to the LEC 154 described in connection with FIGS. 8 and 9 will become apparent to those skilled in the art. Unwanted wavelengths of light can be excluded from the LEC by employing a multiple layer interference film or an optical filter in conjunction with the optical window 178 of optical tree 162. A more desirable distribution of light within the optical tree may be achieved by replacing optical window 178 with a plain lens, a Fresnel lens or a graded parabolic refractive indexed rod lens. Curved, mirrored sections 180 of trunk portion 166 may be replaced by appropriately angled flat mirrors, segmented mirrors, or right-angle prisms. The top and bottom surfaces 172 of each optical branch 168 may be flat or curved, and the surfaces may have grooves or other mechanical deformations arranged thereon to distribute light in a more desirable pattern across the solar cell arrays 164. The grooved optical glass elements 194, 196 depicted in FIG. 9 may be integrally combined with photochemical glass sheets 184 as a means of reducing the number of optical elements in each LEC compartment. Alternately, the grooved optical glass elements may be replaced by other types of lens elements or eliminated altogether. Both the mirrored ends 182 of optical branches 168 in FIG. 8 and the mirrored surfaces 200 positioned at the terminus of compartments 160 in FIG. 9 may be fabricated in concave or convex curved fashion to further enhance the distribution of light across solar cell arrays 164. Finally, the optical tree 162 of FIGS. 8 and 9, including the trunk portions and optical branches, may be constructed as a hollow chamber rather than in the form of a solid, single piece of optical grade plastic. Such a chamber would have highly reflective interior walls corresponding to reflective surfaces 170 and transparent or beam splitting optical windows along the areas corresponding to transparent surfaces 172.

Another promising area of endeavor with regard to the present invention lies in adapting the LEC's of FIGS. 6 through 9 for use in marine environments. An array of water tight non-metallic solar collection panels, panels such as might be fabricated from flexible transparent plastic material or the like, would be designed to float in water with the light gathering surfaces of the panel facing skyward. The inherent flexibility of the plastic would enable the entire panel array to bend with ease, thus preventing structural distortion or other damage by allowing the entire panel array to conform to the motion of the waves. Collected sunlight would be channeled into optical fiber lightpipes and conducted to LEC arrays or other devices for conversion into electricity, heat or usable light. The solar devices may be mounted at fixed locations on either the seashore or seabottom or they may be carried by divers with suitably constructed lightpipe delivery systems. Alternatively, large solar collection panel arrays could be towed behind a ship to provide some or all of the light, heat and electric power required by the ship.

Flexible solar collection panel arrays will, of course, be as usable on land as at sea. When not collecting solar radiation, such arrays can be rolled up for convenient transportation and storage. Accordingly, flexible solar collection panels in combination with suitable LEC arrangements would prove of great benefit in providing electrical power at campsites, construction sites, or military field sites. Flexible panels could also be employed as roofing material for tents, pavillions and other temporary structures.

Utilization devices other than converters for producing electricity may be connected to the solar collection panels of the present invention. Indeed, the ability to manufacture solar collection panels and lightpipe delivery systems for transmitting electromagnetic radiation to various remote sites opens up the possibility of developing entire classes of fixtures and appliances which operate with optical energy rather than electrical energy. FIGS. 10 through 17 illustrate several such fixtures and appliances for receiving and applying various combinations of visible and infrared radiation. For the sake of convenience, it may be assumed that the infrared and visible radiation are solar in origin, and are collected by the solar collection panels illustrated in FIGS. 1A through 5. However, the devices of FIGS. 10 through 17 are not dependent upon solar energy for operation, and any source of electromagnetic radiation, including radiation emitted from combustion processes, incandescent light bulbs or lasers may actually supply the operating power.

Figure 10:
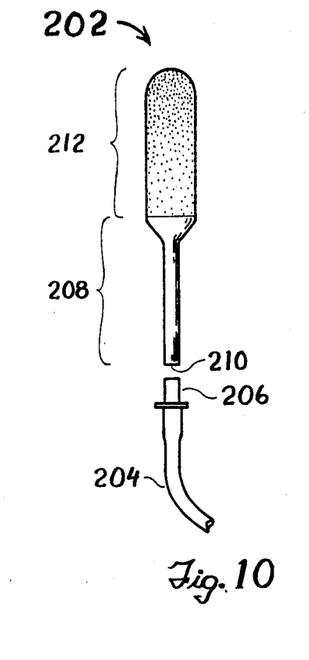
FIG. 10 is a side view of one type of heat distributing element for radiating infrared heat in accordance with the present invention.

The basic design for a heat distributing element is shown in FIG. 10. The heat distributing element 202 consists of a single piece of quartz or other high melting point substance transparent to infrared radiation. The infrared radiation is supplied to heat distributing element 202 through a lightpipe 204 connected to a solar collection panel employing a multiple layer interference film of the type disclosed in the above-mentioned U.S. Pat. No. 3,314,331 issued to Wiley. The infrared radiation is conducted from a suitable lightpipe coupling means 206 into a rod-shaped stem section 208 of heat distributing element 202. Stem section 208 has a diameter slightly greater than the diameter of light pipe 204 and is coated with a material which internally reflects the infrared radiation. Surface 210 of stem section 208 is made optically transmissive to form an optical input window through which radiation enters the heat distributing element. A heat radiating section 212 is formed at the end of stem section 208 opposite input optical window 210 by pitting or otherwise mechanically deforming the outer surface of the heat distributing element to permit infrared radiation entering stem section 298 to escape into the surrounding atmosphere. Ideally, the spacing of the pitting is arranged such that the input radiation is uniformly emitted across the entire surface of heat radiating section 212.

It can be seen that stem section 208 serves as both an optical mixer and a separator between heat radiating section 212, which may become quite hot, and the optical coupling means 206, which may not be able to withstand much heat. Radiation entering stem section 208 is generally trapped inside by total internal reflection and can only escape upon reaching heat radiating section 212 and passing through the various pits or deformations. Heat radiating section 212 is depicted as being bulbous in shape, but in reality may be formed to fit any useful configuration. For example, heat radiating section 212 may be elongated with a diameter equal to the diameter of stem section 208. A heat distributing element having an elongated heat radiating section could then be curved to form cylinders which wrap around containers, water pipes, or other volumes to be heated. On the other hand, a spherically or flat shaped heat radiating section may be more advantageous for heating devices such as space heaters or evaporators.

Figure 11:
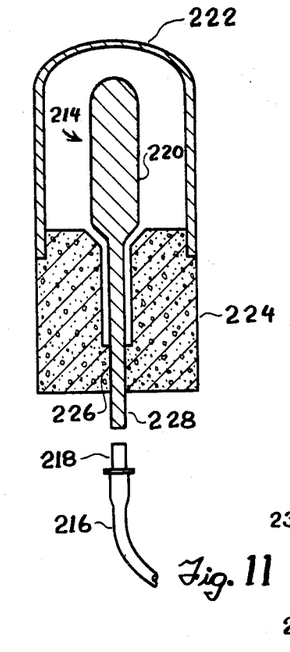
FIG. 11 is a cross-sectional view of a heat-transfer housing for use in conjunction with the heat distributing element of FIG. 10.

FIG. 11 illustrates a heat-transfer housing for use in conjunction with the heat distributing element of FIG. 10. The heat distributing element, indicated at 214 in FIG. 11, again receives infrared radiation from a solar collection panel through a lightpipe 216 and lightpipe coupling means 218. The heat radiating section 220 of heat distributing element 214 is surrounded by an envelope 222 constructed of a high melting point metal such as tungsten or titanium. Infrared radiation escaping from heat radiating section 220 heats envelope 222, in turn causing a net heat transfer to whatever object or material is placed in contact with the envelope. An insulating base 224 formed from an insulating material such as quartz or firebrick secures both envelope 222 and heat distributing element 214 in fixed relationship to one another. Base 224 forms a seal 226 near the bottom of heat distributing element stem section 228 in order to provide as much thermal insulation as possible between envelope 222 and the heat distributing element. The space between envelope 222 and heat distributing element 214 may be vacuum filled to furnish additional thermal insulation.

Figure 12:
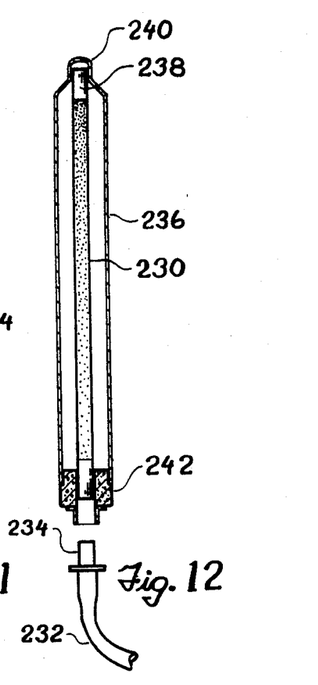
FIG. 12 is a cross-sectional view of a modified heat distributing element and heat-transfer housing for radiating infrared energy in accordance with the present invention.

FIG. 12 illustrates another variation of a heat distributing element constructed in accordance with the present invention and suitable for use in space heaters and the like. Infrared radiation from a solar collection panel and interference film assembly (not shown) is conducted into an elongated heat distributing element 230 through lightpipe 232 and coupling means 234. An elongated envelope 236 surrounds heat distributing element 230 to provide a heat transfer surface. Heat distributing element 230 is given a reflective coating 238 at the point of contact 240 between envelope 236 and the heat distributing element, thereby preventing the envelope from receiving excessive radiation at the contact point. A small insulating base 242 separates heat distributing element 230 and envelope 236, and additionally provides a structure for attaching lightpipe coupling means 234. The FIG. 12 embodiment of the heat distributing element and envelope as just described is generally designed to produce relatively low temperatures and consequently is particularly adapted for home heating applications.

Figure 13:
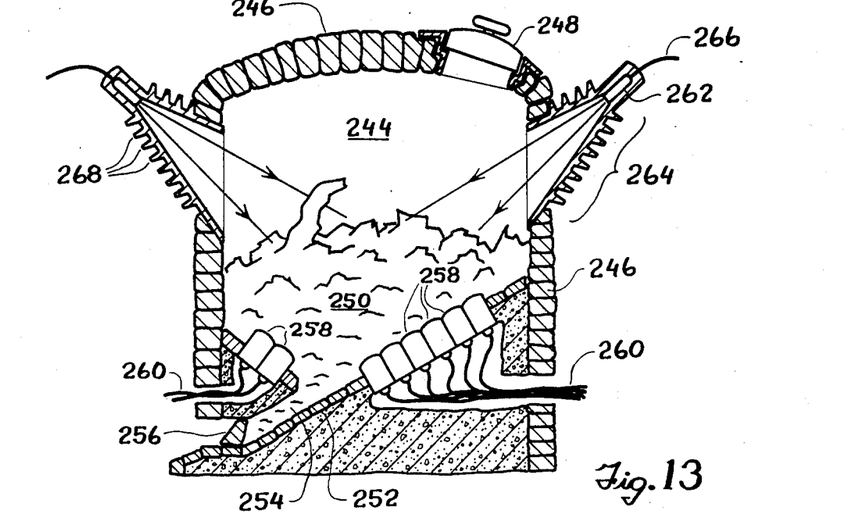
FIG. 13 is a preferred embodiment for a solar heating furnace wherein the heat distributing elements of FIG. 11 are employed to supply heat for the operation of the furnace.

Other configurations of heat distributing elements, however, can provide relatively high temperatures for industrial applications. FIG. 13 illustrates one possible embodiment of a furnace for melting scrap metal, wherein heat distributing elements of the present invention are used to heat the contents of the furnace. The furnace includes a furnace chamber 244 lined with firebrick 246, a hatch 248 for inserting metal ingots or scrap metal 250 into furnace chamber 244, and an outside supporting shell (not shown). The floor 252 of the furnace is wedge or cone shaped and serves to funnel molten metal into a channel 254 at the furnace bottom. Molten metal can thereafter be extracted by removing a plug means 256 from the channel. A plurality of heat distributing elements 258 similar to heat distributing element 214 and envelope 222 illustrated in FIG. 11 are arranged around the furnace floor 252 to provide direct thermal contact with the lower layer of metal 250. Infrared radiation furnishes the heat to melt the metal, and is supplied to the heat distributing element/envelope combinations 258 via a lightpipe delivery system 260. Each individual lightpipe and heat distributing element envelope combination functions in a manner anaglous to that previously described in connection with FIGS. 10 through 12 to provide high temperature heat transfer between the heat distributing element/envelope combinations 258 and the metal 250. If desired, additional radiant heat can be supplied to the contents of the furnace by focusing high intensity light on the metal through one or more lens systems 262. Lens systems 262 are mounted in cone shaped metal housings 264 on the sides of the furnace and receive infrared radiation from lightpipes 266. A series of cooling fins 268 can be formed around metal housings 264 to aid in keeping lens systems 262 and the associated lightpipe coupling arrangements (not shown) as cool as possible. Auxiliary heat may also be supplied to the furnace by a natural gas burner (not shown) or other conventional heating element in order to maintain the heating capacity of the furnace during periods of little or no sunlight.

Figures 14, 15, 16:
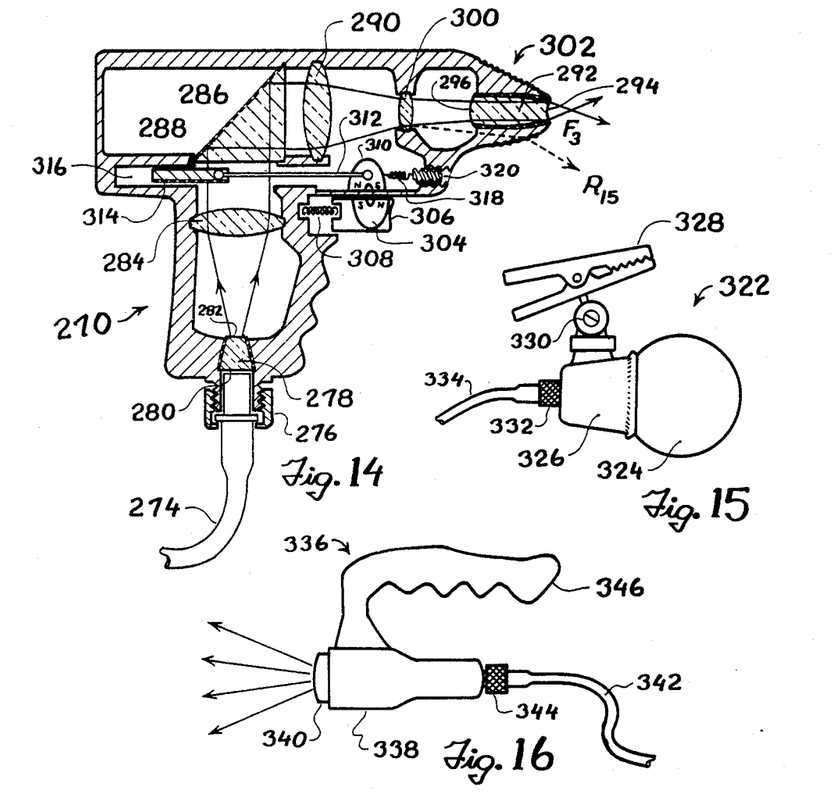
FIG. 14 is a cross-sectional view of a solar welder for converting infrared radiation into a point source of heat for use during welding operations.
FIG. 15 illustrates one embodiment of a lighting fixture constructed to receive light from a remote solar collection site in accordance with the present invention.
FIG. 16 is a second embodiment of a lighting fixture constructed in accordance with the present invention wherein the lighting fixture is portable.

Another and somewhat different type of heat transfer device constructed in accordance with the present invention is embodied in the hand-held welder 270 for underwater use as illustrated in FIG. 14. Welder 270 comprises a pistol-shaped housing 272 fabricated from metal, glass, plastic or other durable material. Where glass or plastic material is employed, the housing can be made transparent to assist in locating damaged welder components. Solar heat radiation such as infrared radiation is conducted from a solar collection panel (not shown) through a lightpipe 274 to a lightpipe coupling means 276 and enters the welder via an optical input window means 278 constructed from glass or other optical grade material. The sides of optical input window means 278 contain mirror coatings while the transmission faces are transparent with curved lens like surfaces. The optical input window means is secured to housing 272 in a manner which prevents water from entering the interior of the housing. A first lens element 284 mounted inside housing 272 focuses the radiation emerging from optical input window means 278 onto the mirrored coating 286 of prism 288. Prism 288 in turn serves to bend the radiation through a second lens element 290 toward the optical output window means 292. Radiation received at the optical output window means 292 is directed to the outside of welder 270 and focused at an external focal point $F_3$ to form a point source of radiation with an intensity sufficient to carry out the welding operation. Either or both of the transparent transmission faces 294, 296 on the optical output window means 292 may be curved in lens-like fashion while the sides of the optical output window means are mirror coated. Additional lens elements such as 300 may be placed inside housing 272 at points along the radiation path to further modify the directional and intensity characteristics of the radiation beam travelling through the welder. The tip 302 of welder housing 272 may contain a colored transparent substance which will assist the user in positioning welder 270 when illuminated by stray rays of radiation such as $R_{15}$ occasionally omitted during the welding operation.

A trigger mechanism in the welder is employed to interrupt the transmission of radiation through the welder housing 272 when desired. A first magnet 304 is secured to a trigger 306 slidably mounted on the exterior of housing 272, and a spring 308 normally biases trigger 306 in a fully extended position. A second magnet 310 is reciprocally mounted in the interior of housing 272 such that magnet 310 tracks the movement of magnet 304 when trigger 306 is depressed against the force of spring 308. A push-pull rod 312 interconnects magnet 310 with a sliding mirror 314. Sliding mirror 314 is normally positioned in the radiant path between optical input window means 278 and prism 288 and thus serves to reflect all incoming radiation back through the optical input window means toward lightpipe 274. When trigger 306 is depressed, however, magnet 304 slides in a direction which causes magnet 310 and associated rod 312 to push sliding mirror 314 back into compartment 316, out of the way of the incoming radiation. Thereafter, an unobstructed radiant path is formed between optical input window means 278, first lens element 284, prism 288, second lens elements 290, optical output window means 292 and radiation focal point $F_3$. Spring 318 is used to bias magnet 310 and sliding mirror 314 toward the normal interrupting or non-operating position. An adjustment screw 320 may be used to adjust the tension of spring 318.

Figure 17:
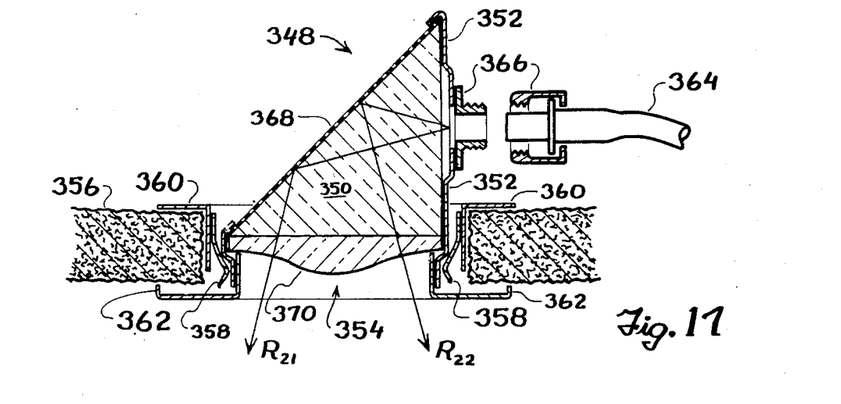
FIG. 17 is a cross-sectional view of a recessed lighting fixture constructed in accordance with the present invention for mounting in the ceiling panel of a home, store, office or other building.

Three different types of lighting fixtures suitable for connection via lightpipes to the solar collection panels of the present invention are shown in FIGS. 15, 16, and 17. The lighting fixture 322 of FIG. 15 is a wide dispersion lighting fixture which may be used in either land or undersea environments, and includes a bulb section 324 joined to a short stem section (not shown). A housing 326 surrounding the stem section rigidly supports bulb section 324, and is linked to a clamp structure 328 by a ball joint 330. The bulb and stem sections are fabricated from a single piece of glass or plastic with translucent characteristics such that light travelling through the glass or plastic is thoroughly diffused and emerges randomly in all directions from lighting fixture section 322. The surface of bulb section 324 may additionally be sandblasted or otherwise mechanically deformed to further diffuse the emitted light. A lightpipe coupling means 332 joined to the stem section at the bottom of housing 326 serves to couple light radiation arriving from a solar collection panel (not shown) through lightpipe 334. The clamp and ball joint structure provides versatility in securing and adjusting lighting fixture 322 relative to the area being illuminated.

FIG. 16 illustrates a portable projection lamp 336 including a housing 338 with a series of one or more internally-mounted lenses (not shown) and an optical output window 340. Light from a solar collection panel is conducted through lightpipe 342, lightpipe coupling means 344 and the series of lenses before radiating out of the optical output window. If desired, a handle 346 can be formed on housing 338 to permit a user to handcarry projection lamp 336.

FIG. 17 is a cross-sectional view of a recessed lighting fixture 348 as mounted in a ceiling panel of a home, store, office or other building. Fixture 348 comprises a solid right angle prism 350 partially surrounded by a housing 352 and positioned in a hole 354 in the ceiling panel 356. A plurality of spring clips 358 simultaneously engage housing 352 and plaster ring 360 formed around the periphery of hole 354, thereby fixedly securing fixture 348 to ceiling panel 356. A decorative face ring 362 may be attached to housing 352 to shield spring clips 358 from view. Light enters the fixture through a light pipe 364 and lightpipe coupling means 366 and travels directly into the solid right angle prism 350. A mirrored coating 368 on one side of prism 350 acts to redirect all of the input light toward opening 354 and out into the room beneath the ceiling panel. Because light traveling through a lightpipe tends to emerge at near perpendicular angles to the cut and polished lightpipe face employed in conjunction with the lightpipe coupling means, generally only small intensities of light would be projected into prism 350 at angles dispersed from the optical axis of lightpipe 362. Accordingly, when using a light fixture such as fixture 348 for general illumination purposes it is often desirable to spread light leaving the fixture out over a wider range of angles. To this end, a light redistribution disk or plate 370 is secured to the underside of prism 350. In the embodiment of FIG. 17 redistribution disk 370 exhibits a cross-sectional profile having a relatively high convex curvature around the disk center with flatter or even slightly concave surfaces near the disk edges. Other redistribution schemes such as those employing Fresnel lenses, however, may be used in lieu of disk 370. The ultimate criterion for choosing a particular disk is one of convenience, and the only constraint imposed is that of generating a wide enough dispersion for uniform radiation from the fixture.

A number of modifications to the recessed lighting fixture of FIG. 17 are possible. Prism 350, for instance, may be replaced by a mirror mounted at an appropriate angle, or the lightpipe coupling means 366 could be relocated at the top of the fixture to eliminate entirely the need for redirecting the light. A suitable light redistribution disk, of course, would still have to be employed in such an arrangement. The entire recessed fixture could be rotatably mounted to vary the direction of light projection, and means for inserting colored transparent filters in the path of the outgoing light could be provided to add a decorator touch.

In some applications, it may be desirable to furnish lighting fixtures which can distribute either light delivered via lightpipe means or light generated within the fixture itself by conventional electrical means. Combination fixtures of this type could use solar light by day and artificial light by night. Several methods of adapting different light sources for projection to the same output means are possible. One method employs a complex reflector structure having three focal points. The output from a lightpipe is focused at one focal point and the output from an artificial light source is focused at a second focal point. In either case, light is subsequently reflected to the third focal point for transmission through a conventional projection or light dispersion means into the rroom or area to be illuminated. Tri-focus reflectors are typically made with two elliptical reflectors having a common focus which serves as the third or output focus just described. A second method of alternating the use of artificial and solar light is based upon channeling the artificial light into a lightpipe which subsequently merges in an optical merge device with a lightpipe carrying solar radiation. The combined lightpipe is then connected to one of the lighting fixtures illustrated in FIGS. 15 through 17.

Several embodiments of the present invention have been specifically shown and described herein. It is understood as well that additional changes and modifications to the form and detail of the various solar collection and utilization devices illustrated above may be made by those skilled in the art without departing from the scope and spirit of the present invention. It is thus the intention of the inventor to be limited only by the following claims.

I claim:

1. A panel structure for collecting and distributing electromagnetic radiation, said panel structure comprising:
   (a) a radiation gathering means for gathering electromagnetic radiation incident thereon and for transmitting electromagnetic radiation so gathered;
   (b) light collection chamber means positioned to receive the electromagnetic radiation transmitted from said radiation gathering means, said radiation gathering means including a plurality of cell structures each having a focusing means for focusing electromagnetic radiation incident thereon toward said light collection chamber means, the exterior surface of said light collection chamber means including at least one optical window positioned relative to each said cell structure such that the electromagnetic radiation focused by each said focusing means toward said light collection chamber means passes through said optical window to be received by said light collection chamber means;
   (c) reflecting means mounted within said light collection chamber means for redirecting the electromagnetic radiation received by said light collecton chamber means; and
   (d) light trap means for capturing the electromagnetic radiation redirected by said reflecting means and for conducting the electromagnetic radiation so captured away from said light collection chamber, said light trap means including at least one transparent entrance window means positioned along the interior surface of said light collection chamber means to enable the electromagnetic radiation redirected by said reflecting means to enter said light trap means.

2. A panel structure as set forth in claim 1, wherein said light trap means further includes a transparent exit window means positioned at a point removed from said transparent entrance window means to permit radiation captured and conducted from said light collection chamber means by said light trap means to escape from said light trap means.

3. A panel structure as set forth in claim 2, including a concentrating means for reducing the angular dispersion of electromagnetic radiation escaping from said transparent exit window means.

4. A panel structure as set forth in claim 3, wherein said concentrating means includes at least one series of lenses.

5. A panel structure as set forth in claim 3, wherein said concentrating means includes a first series of lenses which reduce the angular dispersion of electromagnetic radiation escaping from said transparent exit window means to form a coherent beam and a second series of lenses which receive said coherent beam and further reduce the angular dispersion of the electromagnetic radiation contained therein to focus said coherent beam toward a predetermined point.

6. A panel structure as set forth in claim 5, including a lightpipe means for receiving said coherent beam from said concentrating means and for conducting electromagnetic radiation contained in said coherent beam away from said panel means.

7. A panel structure as set forth in claim 1, wherein each said focusing means includes at least one lens element.

8. A panel structure as set forth in claim 7, wherein said lens element is a Fresnel lens.

9. A panel structure as set forth in claim 7, wherein each said focusing means includes two lens elements.

10. A panel structure as set forth in claim 1, wherein said plurality of cell structures are arranged in a matrix array across the top of said light collection chamber means and said top includes a corresponding plurality of optical windows respectively formed beneath each of said cell structures.

11. A panel structure as set forth in claim 10, including a mirrored surface extending between each said focusing means and each said optical window.

12. A panel structure as set forth in claim 11, wherein each said mirrored surface is constructed as a six-sided pyramidal mirror.

13. A panel structure as set forth in claim 1, wherein all of the interior surfaces of said light collection chamber means except said transparent entrance window means are covered with a mirrored coating.

14. A panel structure as set forth in claim 1, wherein said light trap means includes an interference film means for dividing the electromagnetic radiation conducted away from said light collection chamber by said light trap means into at least visible and infrared components.

15. A panel structure for collecting and distributing electromagnetic radiation, said panel structure comprising:
   (a) a radiation gathering means for gathering electromagnetic radiation incident thereon and for transmitting the electromagnetic energy so gathered; said radiation gathering means including lens means for collecting radiation over a wide angular range and focusing the radiation so collected into a narrow beam and optical window means positioned to receive said narrow beam of radiation, said optical window means including an aperture bounded by curved mirror surfaces diverging outwardly from said aperture toward said lens means;
   (b) and light transmitting means positioned to receive said beam of radition from said optical window and operating to transmit said radiation as a single beam.

16. The panel structure of claim 15, wherein said light transmitting means includes an elongated optical fiber having one end positioned adjacent said aperture.

17. The panel structure of claim 15, wherein said light transmitting means includes light collection chamber means positioned to receive electromagnetic radiation from said aperture, and reflecting means mounted within said light collection chamber means for redirecting the electromagnetic radiation received by said light collection chamber means.

18. A panel structure for collecting and distributing electromagnetic radiation, said panel structure comprising:
(a) a radiation gathering means for gathering electromagnetic radiation incident thereon and for transmitting the electromagnetic energy so gathered;
(b) light collection chamber means positioned to receive the electromagnetic radiation transmitted from said radiation gathering means;
(c) reflecting means mounted within said light collection chamber means for redirecting the electromagnetic radiation received by said light collection chamber means, said reflecting means including a plurality of conically shaped mirrors; and
(d) light trap means for capturing the electromagnetic radiation redirected by said reflecting means and for conducting the electromagnetic radiation so captured away from said light collection chamber, said light trap means including at least one entrance window means positioned along the interior surface of said light collection chamber means to enable the electromagnetic radiation redirected by said reflecting means to enter said light trap means.

19. A panel structure as set forth in claim 18, wherein said conically shaped mirrors are right angle cone mirrors having a 90° apex angle.

20. A panel structure as set forth in claim 18, wherein the surfaces of said conically shaped mirrors as viewed in cross-section are comprised of parabolas.

* * * * *